(12) United States Patent
Vandergrift

(10) Patent No.: US 7,936,085 B2
(45) Date of Patent: May 3, 2011

(54) DC VOLTAGE THRESHOLD DETECTOR

(75) Inventor: Adrian E. Vandergrift, Rockton, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 224 days.

(21) Appl. No.: 12/423,880

(22) Filed: Apr. 15, 2009

(65) Prior Publication Data
US 2010/0264725 A1    Oct. 21, 2010

(51) Int. Cl.
*B60L 1/00*    (2006.01)
*B60L 3/00*    (2006.01)
*H02G 3/00*    (2006.01)

(52) U.S. Cl. ...................................................... 307/9.1

(58) Field of Classification Search ............... 307/9.1; 323/299; 361/78, 88, 91.1
See application file for complete search history.

(56) References Cited

U.S. PATENT DOCUMENTS

| | | |
|---|---|---|
| 5,036,267 A | 7/1991 | Markunas et al. |
| 5,036,449 A | 7/1991 | Dhyanchand et al. |
| 5,055,765 A | 10/1991 | Rozman |
| 5,495,381 A | 2/1996 | Mrowiec et al. |
| 6,097,241 A | 8/2000 | Bertin et al. |
| 6,559,608 B2 | 5/2003 | Wicklund |
| 6,885,215 B1 | 4/2005 | Hou et al. |
| 6,930,538 B2 | 8/2005 | Chatal |
| 7,061,305 B2 | 6/2006 | Kim |
| 7,227,399 B2 | 6/2007 | Ajram et al. |
| 2007/0120694 A1 | 5/2007 | Lindsey et al. |

*Primary Examiner* — Jared J Fureman
*Assistant Examiner* — Carlos Amaya
(74) *Attorney, Agent, or Firm* — Carlson, Gaskey & Olds

(57) ABSTRACT

A voltage detection circuit comprises a tap to be connected to a positive line and a return tap to be connected to a return line on a power supply. The potential difference between the positive line and the return line is the input line voltage. A scaling resistor network scales down the input line voltage to be indicative of a voltage on the input line. The scaled voltage is connected to an input for a comparator. A reference voltage is supplied to the comparator. The reference voltage supplied to the comparator is indicative of a threshold voltage at which an output of the circuit changes states. An output of the comparator communicates a signal to an optical isolation device when the input line voltage is below the threshold voltage to turn the optical isolation device on and send a signal to an output of the optical isolation device. The optical isolation device is not turned on if the input line voltage exceeds the threshold voltage. A DC power bus incorporating the voltage detection circuit, along with an aircraft electrical system incorporating the DC power bus are also disclosed and claimed.

15 Claims, 3 Drawing Sheets

DC VOLTAGE THRESHOLD DETECTOR

BACKGROUND OF THE INVENTION

This application relates to a DC voltage threshold detector to be associated with a high voltage power bus.

Power busses are often provided for distributing voltage across a vehicle. As one example, an aircraft is typically provided with a DC power bus wherein power generated by the gas turbine engines is passed across the DC power bus, and utilized to power accessories and systems across the aircraft. The nature of an aircraft generation system includes the fact that the voltage on the bus may vary.

In the aircraft system, a generator control unit will receive an AC voltage from a generator. The generator control unit rectifies the AC power and filters it to create a high voltage DC bus. Some circuits that are powered from this high voltage DC bus need to know when the voltage crosses a specific threshold.

It is typically desirable to have the ability to send a signal to various systems should an unusually high voltage be sensed on the power bus. To date, systems for providing such signals have been complex and undesirably large.

SUMMARY OF THE INVENTION

A voltage detection circuit has a tap to be connected to a positive line and a return tap to be connected to a return line on a power supply. The potential difference between the positive line and the return line is the input line voltage. A scaling resistor network scales down the input line voltage to be indicative of the voltage on the input line. The scaled voltage is connected to an input for a comparator. A reference voltage is supplied to the comparator. The reference voltage supplied to the comparator is indicative of a threshold voltage at which an output of the circuit changes states. An output of the comparator communicates a signal to an optical isolation device when the input line voltage is below the threshold voltage to keep the optical isolation device on and send a signal to an output of the optical isolation device. An output of the comparator communicates a signal to an optical isolation device when the input line voltage exceeds the threshold voltage to turn the optical isolation device off and send a signal to an output of the optical isolation device. The optical isolation device is turned on if the line voltage is below the threshold voltage.

A DC power bus incorporating the voltage detection circuit, along with an aircraft electrical system incorporating the DC power bus are also disclosed and claimed.

These and other features of the present invention can be best understood from the following specification and drawings, the following of which is a brief description.

DETAILED DESCRIPTION OF THE PREFERRED EMBODIMENT

Figure 1:
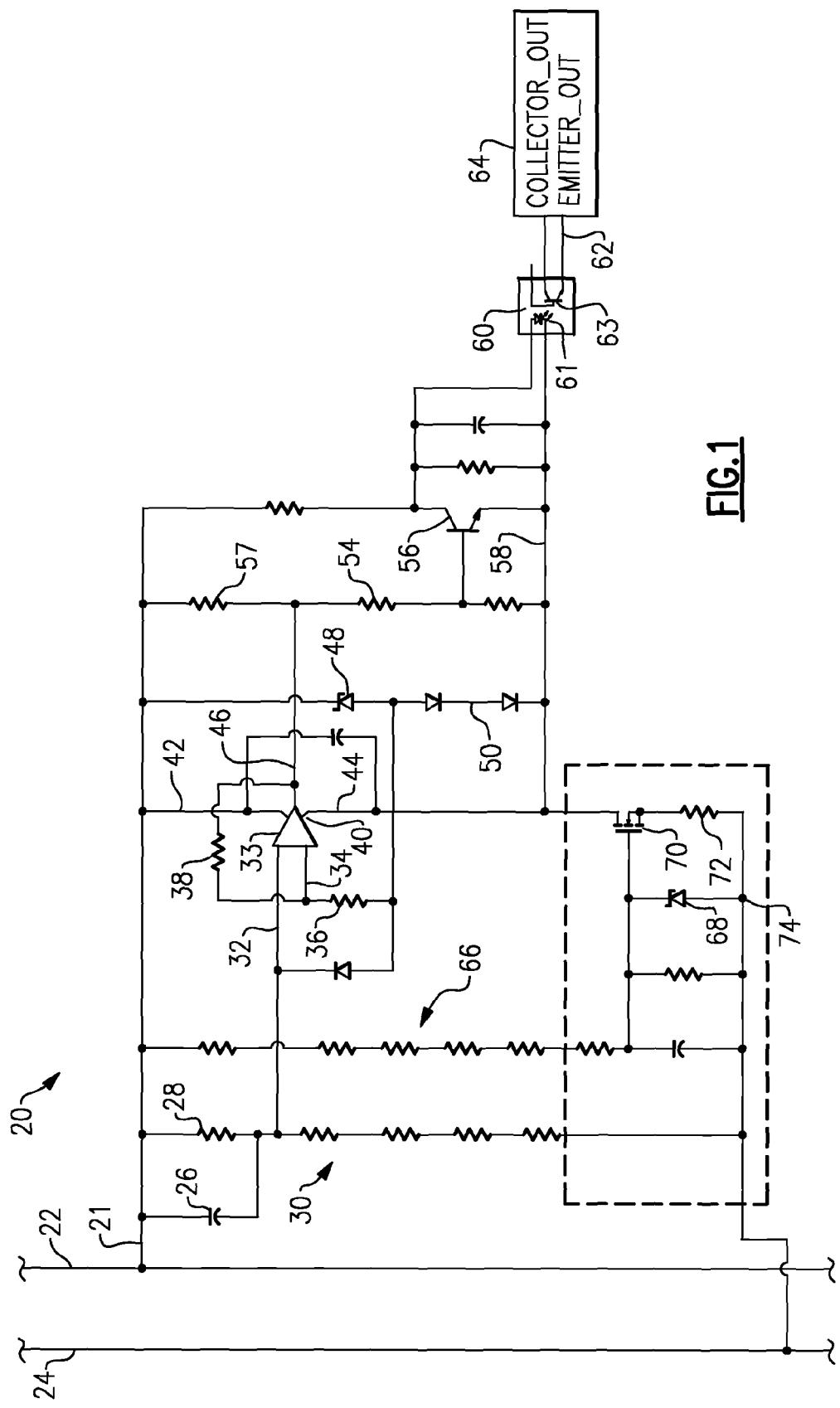
FIG. 1 is a schematic of a first embodiment.

A voltage detection circuit 20 is shown in FIG. 1, having a first tap 21 connected to a positive line 22 from a DC power bus. A second tap 74 is connected to the return line 24 on the DC power bus. This power bus is part of an aircraft electrical system in one embodiment.

Power tapped into the circuit 20 encounters a capacitor 26, and a resistor 28. The voltage is divided down by a series of resistors shown at 30. A line 32 provides a scaled indication of the voltage between line 22 and line 24. Line 32 passes to the negative pin of a comparator 33. Another line 34 connects to the positive pin of the comparator. The reference voltage supplied at line 34 is generally fixed with reference to line 21 across a wide input line voltage range, and is defined in large part by the value of resistors 36 and 38 and the breakdown voltage of diode 48. By varying the resistances of resistors 36 and 38, the reference voltage seen at the pin supplied by line 34 in the comparator 33 can be selected to provide a specific reference voltage to be compared to the voltage supplied on line 32. The voltage supplied at line 32 will be known as a lower line voltage for purposes of this application, and the voltage supplied at line 34 is a reference voltage.

The comparator 33 has a NPN transistor 40 at an output side communicating to emitter line 44, and a collector line 46. If the transistor 40 is on or closed, then a signal passes downstream on line 46. A series of diodes 48 and 50 provide an effective floating 12-volt power source with line 21 being the positive and line 58 being the return. Resistors 54 and 57 serve to provide a voltage down to transistor 56 which communicates with an optical isolation device 60. If transistor 40 is on, transistor 56 will be off, the light 61 in optical isolation device will be lit, then a signal will be sent to turn on transistor 63, and an output 62 leads to the circuit or circuits 64 which require notice of the threshold being crossed. The circuits 64 are existing circuits on an aircraft, and wherein some indication of a potential voltage threshold is desired for most efficient operation of the circuit.

Thus, should the input line voltage exceed the threshold voltage, a signal will be sent through optical isolation device 60 turning off transistor 63. Circuit 64 can sense that transistor 63 is off or in the open collector state.

On the other hand, if the input line voltage does not exceed the threshold voltage, then the transistor 40 would be on. Transistor 56 is turned off. If the transistor 56 is off, the optical isolation device 60 and its light 61 will be on. Transistor 63 is on, or closed. Circuit 64 can sense that transistor 63 is on. For purposes of this application, transistor 56 will be known as a control transistor.

In addition, a low current sink is providing by a series of resistors 66, and a field effect transistor (FET) 70, in combination with a voltage clamp diode 68 providing a voltage source to the transistor 70, and to a resistor 72. The transistor 70 is effectively turned on at a low voltage, e.g. 4 volts. Thus, it effectively turns on whenever a voltage is sensed from the bus 22/24. However, it operates in conjunction with the resistor 72 to regulate the flow of current back to the return 24 through line 74. As the input line voltage changes, the voltage from line 58 to line 74 changes also, but the current being sunk through transistor 70 remains essentially constant.

Figure 2:
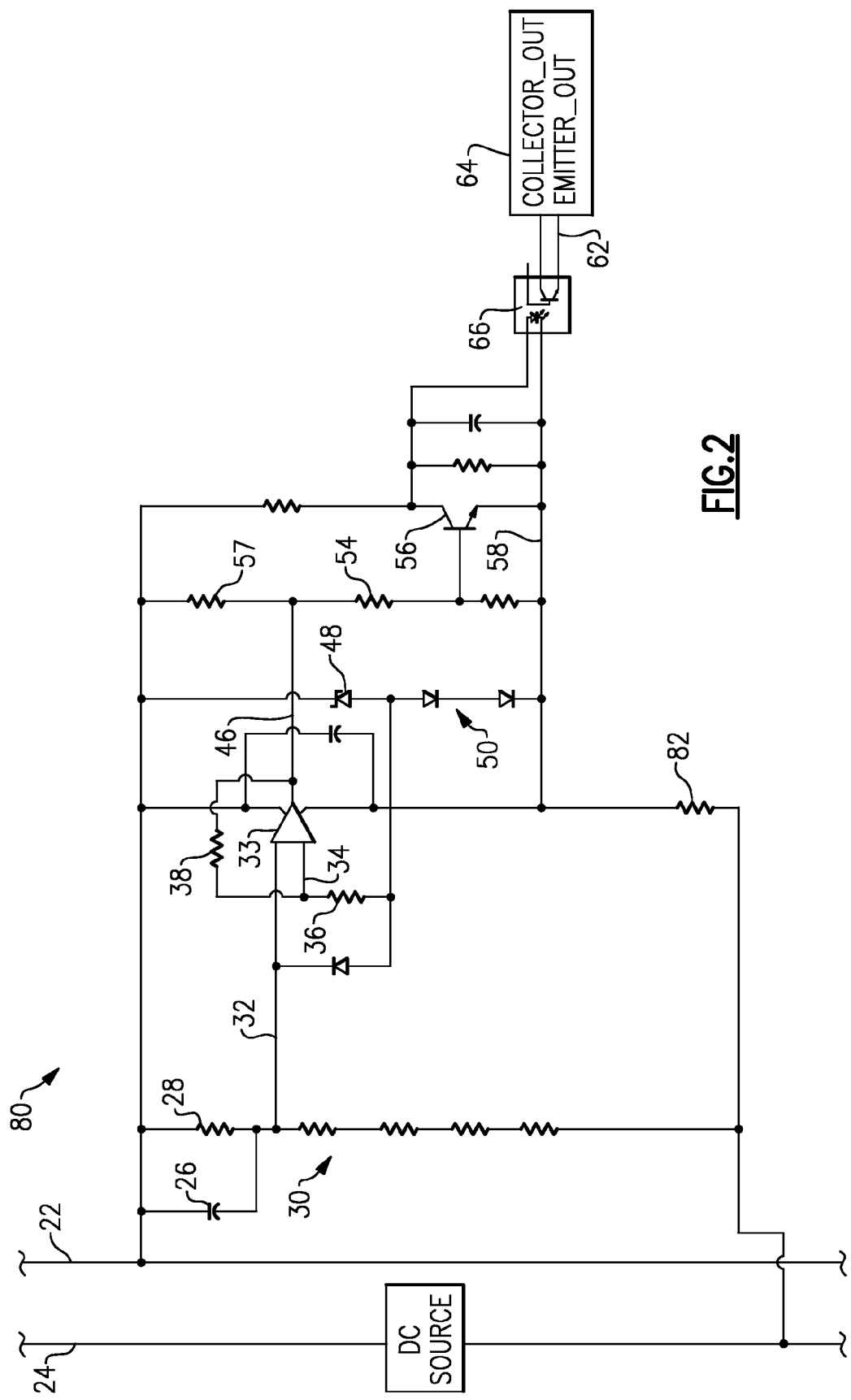
FIG. 2 is a schematic of a second embodiment.

FIG. 2 shows another embodiment 80, which operates quite similarly to the circuit 20. However, the low current sink in the circuit 20 is replaced by a single resistor 82. The resistor 82 will likely need to be much larger than the resistor 72 in the FIG. 1 embodiment. Still, this circuit should operate and provide the general benefits provided by the FIG. 1 embodiment.

The circuits of FIGS. 1 and 2 provide several benefits. One main benefit is that they supply power from the high voltage they sense. Also, the use of the optical isolation device isolates the output from the input. Therefore, the circuits 64 do not need to be referenced to the detection circuits 20 or 80. Further, the circuit can be easily scaled for expected inputs between hundreds of volts to well over one thousand volts simply by properly sizing the various transistors within the circuit, and in particular the FET 70 and the optical isolation device 60. Also, the threshold can be easily adjusted simply by changing the resistances of the resistors 36 and 38 and/or the voltage dividing sense resistors 28 and 30.

Figure 3A:
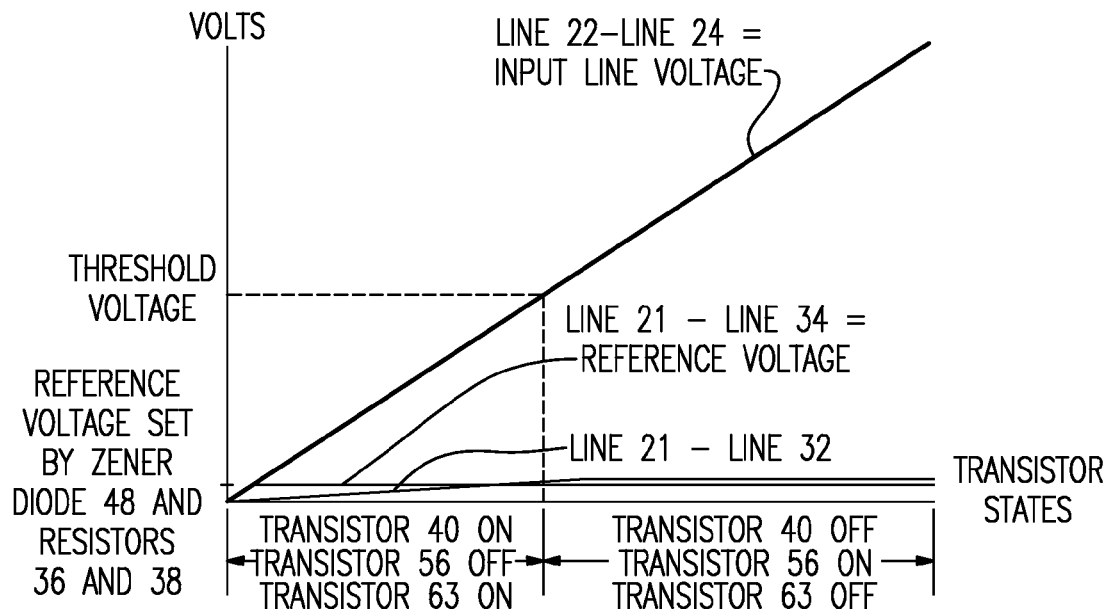
FIG. 3A is a graph showing the relationship of certain voltages in the disclosed system.

FIG. 3A shows the input line voltage increasing toward a threshold voltage, and showing the voltages at the two inputs to the comparator, and how they might vary as the input line voltage changes to change the states of transistors 40, 56, and 63.

Figure 3B:
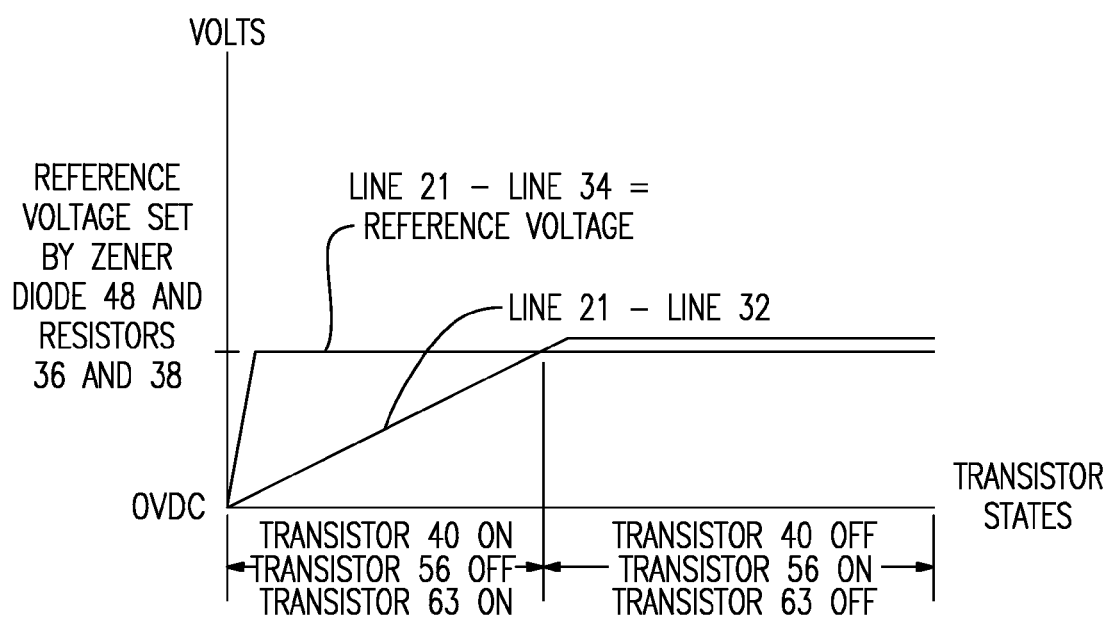
FIG. 3B is a graph showing other relationships.

FIG. 3B shows an increased scale version of the features shown in the lower portion of FIG. 3A.

Although an embodiment of this invention has been disclosed, a worker of ordinary skill in this art would recognize that certain modifications would come within the scope of this invention. For that reason, the following claims should be studied to determine the true scope and content of this invention.

What is claimed is:

1. A voltage detection circuit comprising:
   a tap to be connected to a positive line and a return tap to be connected to a return line on a power supply;
   a scaling resistor network for scaling down an input line voltage to be indicative of a voltage on the input line, said scaling resistor network being connected to an input for a comparator;
   a reference voltage to be supplied to the comparator; and
   an output of said comparator communicating a signal to an optical isolation device when said input line voltage exceeds a threshold voltage to turn said optical isolation device off and send a signal to an output of said optical isolation device, said optical isolation device being turned on if said input line voltage falls below said threshold voltage.

2. The circuit as set forth in claim 1, including a comparator transistor, and said comparator transistor being off when said threshold voltage is exceeded by said input line reference voltage, and not powering said optical isolation device, and said comparator transistor being on when said threshold voltage exceeds said input line voltage such that said optical isolation device is not powered.

3. The circuit as set forth in claim 2, wherein a control transistor is off when said comparator transistor is on, and said control transistor is on when said comparator transistor is off, and when said control transistor is on, the power to said optical isolation device being blocked.

4. The circuit as set forth in claim 1, wherein a voltage to power said circuit is provided with a tapped voltage from the positive line.

5. The circuit as set forth in claim 1, wherein a current sink is provided to regulate the current needed to power the detection portion of said circuit.

6. The circuit as set forth in claim 5, wherein the current sink includes a field effect transistor operating in conjunction with a resistor and a voltage source.

7. The circuit as set forth in claim 5, wherein said current sink includes a single resistor.

8. The circuit as set forth in claim 1, wherein said threshold voltage is defined in part by a resistor network connected to a line received on one pin of the comparator.

9. A DC power bus for an aircraft comprising:
   a high voltage positive line and a high voltage negative line; and
   a detection circuit including a tap connected to the positive line and a return tap to be connected to the return line, a scaling resistor network for scaling an input line voltage to be indicative of a voltage on the input line, said scaling resistor network being connected to an input for a comparator, a reference voltage supplied to the comparator, and an output of said comparator communicating a signal to an optical isolation device when said input line voltage exceeds a threshold voltage to turn said optical isolation device off and send a signal to an output of said optical isolation device, said optical isolation device being on if said threshold exceeds said input line voltage.

10. The DC power bus as set forth in claim 9, including a comparator transistor, and said comparator transistor being off when said threshold voltage is exceeded by said input line voltage, and powering said optical isolation device, and said comparator transistor being on when said threshold voltage exceeds said input line voltage such that said optical isolation device is powered.

11. The DC power bus as set forth in claim 10, wherein a control transistor is off when said comparator transistor is on, and said control transistor being on when said comparator transistor is off, and when said control transistor is on, the power to said optical isolation device being blocked.

12. The DC power bus as set forth in claim 9, wherein a current sink is provided to regulate the current needed to power the detection portion of said circuit.

13. The DC power bus as set forth in claim 9, wherein said threshold voltage is defined in part by a resistor network connected to a line received on one pin of the comparator.

14. An aircraft electrical system comprising:
   at least one circuit to be provided with an indication of a threshold being crossed on a DC power bus;
   a DC power bus including a high voltage positive line and a high voltage return line;
   a detection circuit including a tap connected to the positive line and a return tap to be connected to the return line, a scaling resistor network for scaling an input line voltage to be indicative of a voltage on the input line, said scaling resistor network being connected to an input for a comparator, a reference voltage, which is indicative of a threshold voltage, is supplied to the comparator, and an output of said comparator communicating a signal to an optical isolation device when said input line voltage exceeds a threshold voltage to turn said optical isolation device off and send a signal to an output of said optical isolation device, said optical isolation device being on if said threshold exceeds said input line voltage.

15. The aircraft electrical system as set forth in claim 14, including a comparator transistor, and said comparator transistor being off when said threshold voltage is exceeded by said input line voltage such that said optical isolation device is not powered, and said comparator transistor being on when said threshold voltage exceeds said input line voltage, and powering said optical isolation device, and a control transistor is off when said comparator transistor is on, and said control transistor being on when said comparator transistor is off, and when said control transistor is on, the power to said optical isolation device being blocked.

* * * * *